(12) United States Patent
Tso et al.

(10) Patent No.: US 7,595,690 B2
(45) Date of Patent: Sep. 29, 2009

(54) VOLTAGE-CLAMPING DEVICE AND OPERATIONAL AMPLIFIER AND DESIGN METHOD THEREOF

(75) Inventors: Ko-Yang Tso, Jhonghe (TW); Keh-La Lin, Taipei (TW); Yann-Hsiung Liang, Taichung (TW); Chin-Chieh Chao, Hsinchu (TW)

(73) Assignee: Raydium Semiconductor Corporation, Hsinchu (TW)

( * ) Notice: Subject to any disclaimer, the term of this patent is extended or adjusted under 35 U.S.C. 154(b) by 64 days.

(21) Appl. No.: 12/078,844

(22) Filed: Apr. 7, 2008

(65) Prior Publication Data

US 2008/0252375 A1 Oct. 16, 2008

(30) Foreign Application Priority Data

Apr. 10, 2007 (TW) .............. 96112595 A

(51) Int. Cl.
*H03F 3/26* (2006.01)
(52) U.S. Cl. .................. 330/255; 330/267
(58) Field of Classification Search ............ 330/255, 330/264, 267
See application file for complete search history.

(56) References Cited

U.S. PATENT DOCUMENTS 7,358,812 B2 * 4/2008 Portmann et al. .......... 330/255
7,557,658 B2 * 7/2009 Perez ...................... 330/255

* cited by examiner

*Primary Examiner*—Steven J Mottola
(74) *Attorney, Agent, or Firm*—Rabin & Berdo, P.C.

(57) ABSTRACT

A voltage-clamping device used in an operational amplifier is provided. The operational amplifier comprises a first transistor. The cross-voltage between the gate and the source of the first transistor is near to a specific voltage and the cross-voltage between the drain and the source of the first transistor is not equal to zero, so as to generate a big substrate current. The voltage-clamping device comprises a second transistor whose source and gate are respectively coupled to the drain of the first transistor and used for receiving a bias signal, so that the second transistor is biased in saturation region, and the voltage at the source of the second transistor is made equal to the difference between the bias signal and the threshold voltage of the second transistor. Thus, the cross-voltage between the drain and the source of the first transistor is reduced and the substrate current is reduced accordingly.

6 Claims, 3 Drawing Sheets

VOLTAGE-CLAMPING DEVICE AND OPERATIONAL AMPLIFIER AND DESIGN METHOD THEREOF

This application claims the benefit of Taiwan application Serial No. 096112595, filed APR. 10, 2007, the subject matter of which is incorporated herein by reference.

BACKGROUND OF THE INVENTION

1. Field of the Invention

The invention relates in general to a voltage-clamping device, and more particularly to a voltage-clamping device capable of reducing the substrate current and negative effects generated in a transistor of an operational amplifier.

2. Description of the Related Art

Liquid crystal display comprises a source driver, a gate driver and a liquid crystal display panel, wherein the liquid crystal display panel has a pixel array. The source driver provides pixel data to columns of the pixel array and the gate driver turns on corresponding rows of the pixel array to display the desired image. Referring to FIG. 1, a curve of bias voltage vs. substrate current of a transistor of an operational amplifier is shown. According to most conventional technologies, the output buffer of the source driver is implemented by an operational amplifier, and a part of transistors will generate a big substrate current and result in hot electrons due to the high cross-voltage between the gate and the source and that between the drain and the source.

A part of hot electrons flow to the gate of the transistor and is trapped in the gate oxidation layer, causing the threshold voltage, saturation current and the characteristic of the transistor to change with the using time and end up with malfunction. As a result, the conventional operational amplifier and the source driver using the same have the disadvantage of shorter lifespan.

As higher substrate current would also increase the working current of the direct current of the conventional operational amplifier and the source driver using the same, the conventional operational amplifier and the conventional source driver using the same have the disadvantage of high power consumption. When the conventional operational amplifier and the conventional source driver using the same are used in portable products, the portable products will have poor battery life.

Higher substrate current would increase the substrate voltage so as to forwardly turn on the parasitic transistor thereof. Therefore latchup effect or snapback effect would be aroused. As a result, the substrate current increases drastically and more hot electrons are generated, and the above disadvantages are made even worse.

SUMMARY OF THE INVENTION

The invention is directed to a voltage-clamping device and an operational amplifier using the same capable of effectively resolving the disadvantages of high substrate current, having ill effects of hot electrons, latchup and snapback, short lifespan, and higher and power consumption encountered in the conventional operational amplifier. The invention substantially reduces the ill effects caused due to high substrate current, and enables the operational amplifier and the analog circuit using the same to have the advantages of longer lifespan, lower power consumption, and longer battery life.

According to a first aspect of the present invention, a voltage-clamping device used in an operational amplifier is provided. The operational amplifier comprises a first transistor. The cross-voltage between the gate and the source of the first transistor is near to a specific voltage and the cross-voltage between the drain and the source of the first transistor is not equal to zero, so as to generate a big substrate current. The voltage-clamping device comprises a second transistor whose source and gate are respectively coupled to the drain of the first transistor and used for receiving a bias signal, so that the second transistor is biased in saturation region, and the voltage at the source of the second transistor is made equal to the difference between the bias signal and the threshold voltage of the second transistor. Thus, the cross-voltage between the drain and the source of the first transistor is reduced so as to reduce the substrate current accordingly.

According to a second aspect of the present invention, an operational amplifier comprising an input stage circuit and an output stage circuit is provided. The input stage circuit is for receiving a differential signal, so as to generate an intermediate signal accordingly. The output stage circuit is for generating an output signal in response to intermediate signal. The output stage circuit comprises a first and a second transistor. The cross-voltage between the gate and the source of the first transistor is near to a specific voltage, and the cross-voltage between the drain and the source of the first transistor is not equal to zero, so as to generate a big substrate current. The source of the second transistor is coupled to the drain of the first transistor, and the gate of the second transistor receives a bias signal, so that the second transistor is biased in saturation region, and the voltage at the source of the second transistor is made equal to the difference between the bias signal and the threshold voltage of the second transistor. Thus, the cross-voltage between the drain and the source of the first transistor is reduced so as to reduce the substrate current of the first transistor accordingly.

According to a third aspect of the present invention, a circuit design method of an operational amplifier is provided. The method comprises the following steps. Firstly, the operational amplifier having an output circuit comprises a first transistor. The cross-voltage between the gate and the source of the first transistor is near to a specific voltage, and the cross-voltage between the drain and the source of the first transistor is not equal to zero so as to generate a substrate current. Next, a second transistor is disposed in the operational amplifier, wherein the source of the second transistor is coupled to the drain of the first transistor. Afterwards, a bias signal is provided to the gate of the second transistor so that the second transistor is biased in the saturation region, and the voltage at the source of the second transistor is made equal to the difference between the bias signal and the threshold voltage of the second transistor. Thus, the cross-voltage between the drain and the source of the first transistor is reduced so as to reduce the substrate current of the first transistor accordingly.

The invention will become apparent from the following detailed description of the preferred but non-limiting embodiments. The following description is made with reference to the accompanying drawings.

DETAILED DESCRIPTION OF THE INVENTION

Figure 2:
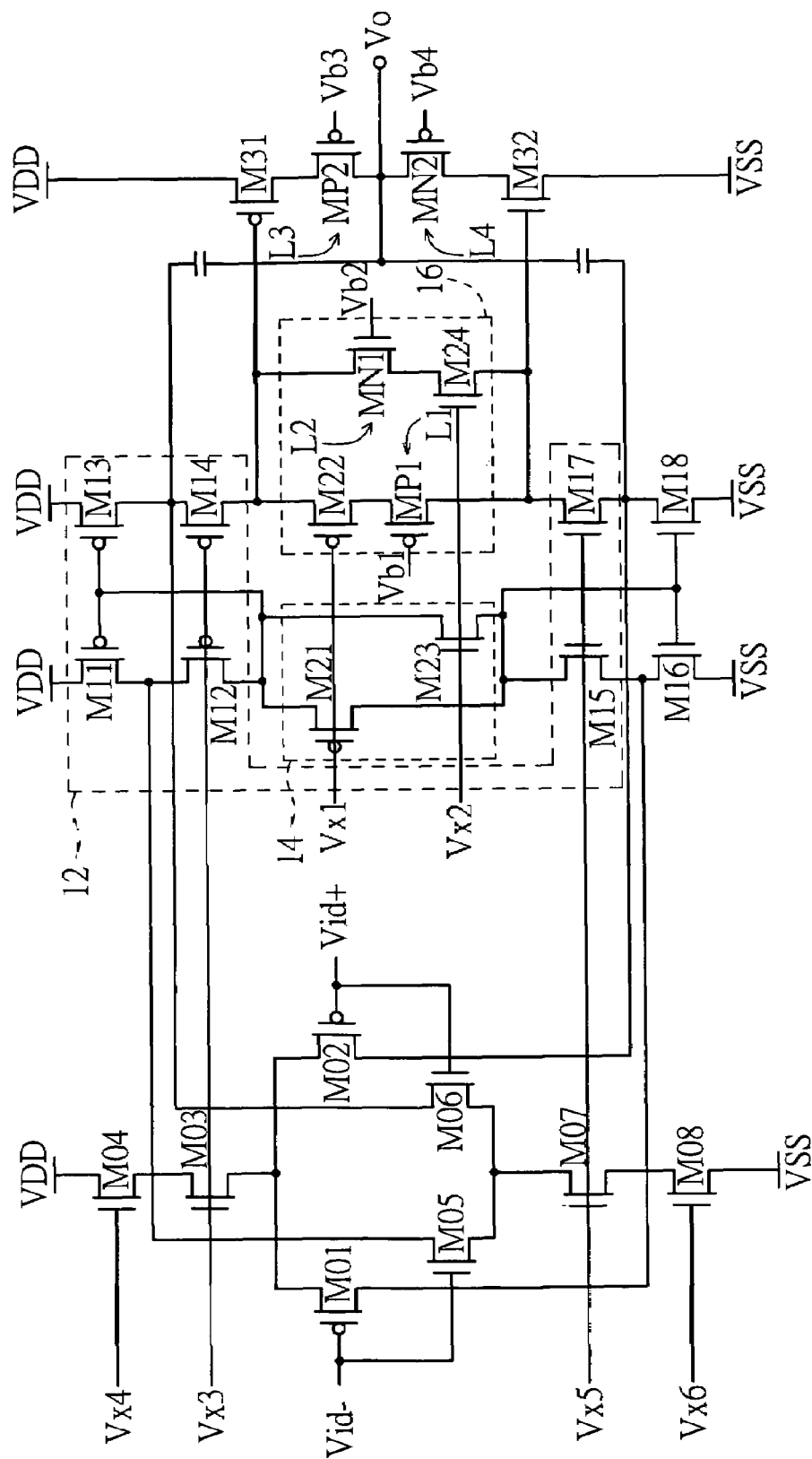
FIG. 2 is a circuit diagram of an operational amplifier according to a first embodiment of the invention.

Referring to FIG. 2, a circuit diagram of an operational amplifier according to a first embodiment of the invention is shown. In the present embodiment of the invention, the operational amplifier 10 is exemplified by a two-stage rail-to-rail I/O operational amplifier. The operational amplifier 10 comprises an input stage circuit and an output stage circuit. The input stage circuit is a rail-to-rail input circuit for receiving two differential input signals Vid+ and Vid− and generating four intermediate signals Vc1~Vc4 according to the differential input signals Vid+ and Vid−. The output stage circuit is a rail-to-rail class AB output circuit for providing an output signal Vo in response to the intermediate signals Vc1~Vc4.

The input stage circuit comprises four input transistors M01, M02, M05 and M06, wherein the input transistors M01 and M02 are both P-type metal oxide semiconductor (PMOS) transistors, and the input transistors M05 and M06 are both N-type metal oxide semiconductors (NMOS) transistors. The input transistors M01 and M02 form the first differential input circuit, and the input transistors M05 and M06 form the second differential input circuit. The first differential input circuit and the second differential input circuit respectively differentiate and amplify the differential input signals Vid+ and Vid− when the common-mode signal of the differential input signals Vid+ and Vid− is near the voltages VSS and VDD, so as to implement a rail-to-rail input circuit. The voltages VDD and VSS are respectively the highest voltage level and the lowest voltage level of the operational amplifier 10.

The input stage circuit further comprises a summing circuit 12 and a floating current source 14. The summing circuit 12 is for driving an output stage circuit in response to the intermediate signal Vc1~Vc4 to provide an output signal Vo. The summing circuit 12 comprises four transistors M1, M13, M15 and M17. The floating current source 14 is for providing a bias current to drive a bias circuit of the summing circuit 12. The floating current source 14 comprises two transistors M21 and M23 for receiving the bias signals Vx1 and Vx2 respectively so as to provide corresponding bias current.

The output stage circuit comprises two transistors M31 and M32 and a class AB output circuit control unit 16. The class AB output circuit control unit 16 is cascaded with the summing circuit 12 and is driven by the floating current source 14 for controlling the output transistors M31 and M32 to provide an output signal Vo. The class AB output circuit control unit 16 comprises two transistors M22 and M24, which receive the bias signals Vx1 and Vx2.

The class AB output circuit control unit 16 further comprises two voltage-clamping devices L1 and L2 respectively coupled to the drains of the transistors M22 and M24. The voltage-clamping devices L1 and L2 reduce the substrate current generated by the transistors M22 and M24 by controlling the voltages at the drains of the transistors M22 and M24. The bias design and operation of the transistor MP1 are disclosed below.

Figure 1:
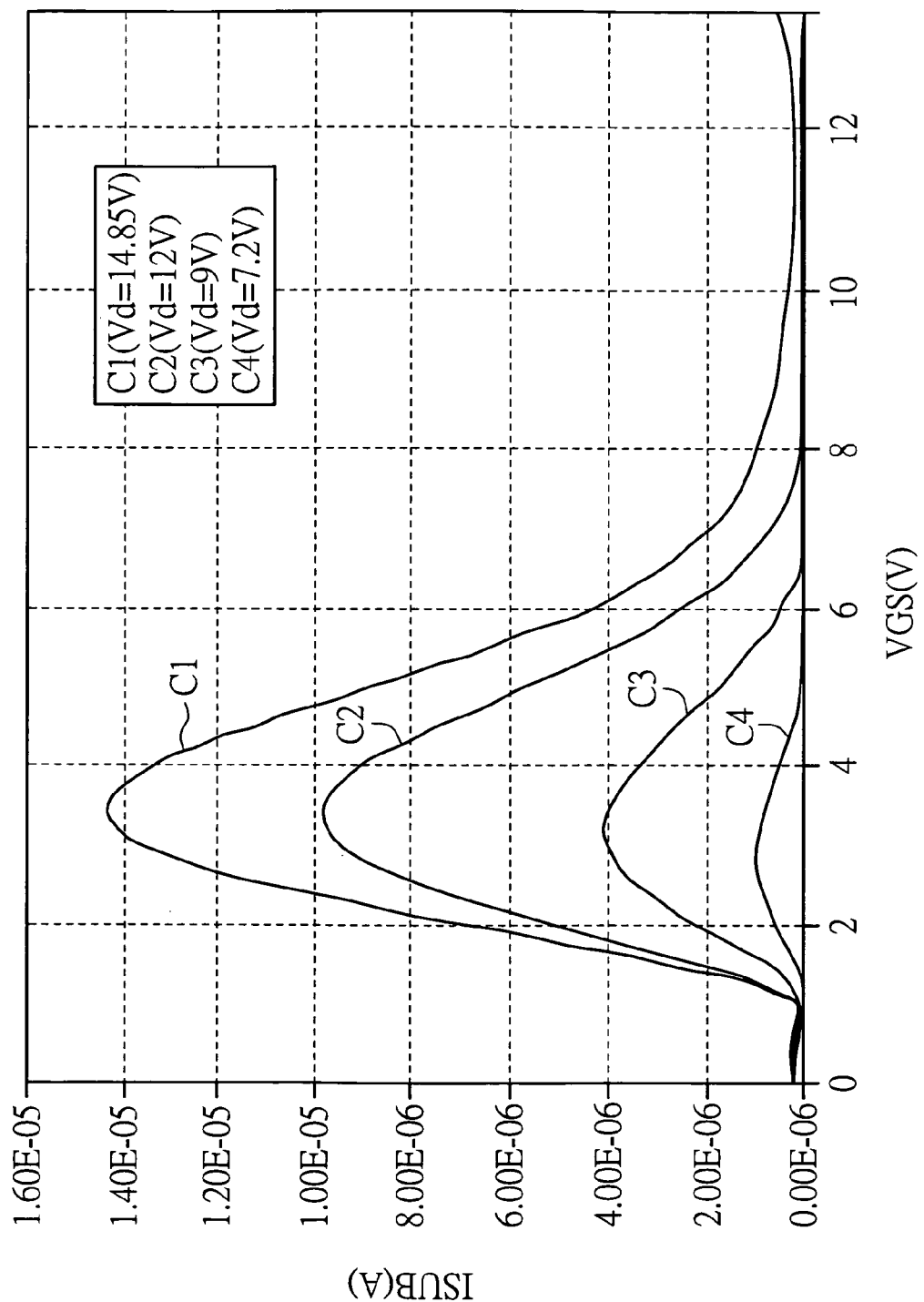
FIG. 1 is a relationship curve of bias voltage vs. substrate current of a transistor of an operational amplifier.

The transistor M22 is biased in saturation region when the operational amplifier 10 operates, so the transistor M22 is biased in that the cross-voltage between the gate and the source and the cross-voltage between the drain and the source are not both equal to zero. Meanwhile, the transistor M22 generates a substrate current, and the curve of the cross-voltage between the gate, the source and the cross-voltage between the drain, and the source vs. the substrate current of the transistor M22 is indicated in FIG. 1. The cross-voltage between the gate and the source of the transistor M22 is near 3V, and the cross-voltage between the drain and the source is near 14.85V. As indicated in FIG. 1, the substrate current generated by the transistor M22 is near $1.40 \times 10^{-5}$A.

In the present embodiment of the invention, the voltage-clamping device L1 has a transistor MP1, wherein the source of the transistor MP1 is coupled to the drain of the transistor M22, the gate of the transistor MP1 receives a bias signal Vb1, and the drain of the transistor MP1 is coupled to the drain of the transistor M17. The bias signal Vb1 makes the transistor MP1 biased in saturation region, and makes the source of the transistor MP1 (that is the drain voltage of the transistor M22) substantially equal to the difference between the bias signal Vb1 and the threshold voltage of the transistor MP1.

Thus, by providing the bias signal Vb1 with different levels, the drain voltage of the transistor M22 is controlled, so as to reduce the cross-voltage between the drain and the source of the transistor M22. Thus, by controlling the drain voltage of the transistor M22, the voltage-clamping device L1 can reduce the substrate current, thereby avoiding ill effects including hot electrons, latchup, snapback, and avoiding the operational amplifier 10 having short lifespan and high power consumption. The voltage-clamping device L2 substantially has similar operation so as to reduce the cross-voltage between the drain and the source of the transistor M24 and the substrate current as well.

In the present embodiment of the invention, the operational amplifier 10 further has two voltage-clamping devices L3 and L4 comprise two transistors MP2 and MN2 respectively, wherein the sources of the transistors MP2 and MN2 are respectively coupled to the drains of the output transistors M31 and M32, and the gates of the transistors MP2 and MN2 respectively receive two bias signals Vb3 and Vb4. The voltage-clamping devices L3 and L4, substantially having similar operation with the voltage-clamping device L1, is capabile of effectively reducing the substrate current by reducing the voltages at the drains of the transistors M31 and M32. Thus, the operational amplifier 10 and voltage-clamping device L1~L4 can reduce the substrate current by reducing the voltages at the drains of the transistors M22, M24, M31 and M32.

In the present embodiment of the invention, the operational amplifier 10 further has a bias circuit, wherein, the operational amplifier 10 comprises four transistors M03, M04, M07, M08 for receiving different bias signals Vx3~Vx6 so as to bias the summing circuit 12 and the input transistors M01, M02, M05, and M06. The operational amplifier 10 further has two Miller capacitors C1 and C2.

Figure 3:
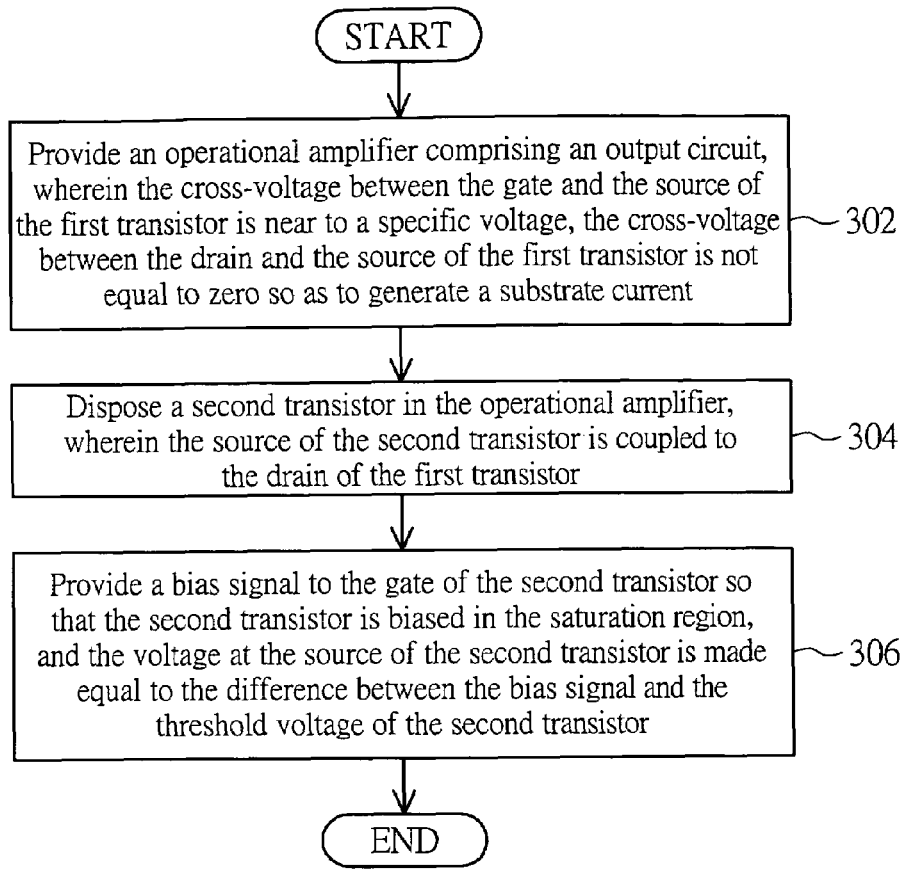
FIG. 3 is a flowchart of a design method of an operational amplifier according to an embodiment of the invention.

Referring to FIG. 3, a flowchart of a design method of an operational amplifier according to an embodiment of the invention is shown. The method begins at step 302, the operational amplifier 10 having an output circuit is provided, wherein the cross-voltage between the gate and the source of the transistors M22, M24, M31 and M32 is near to a specific voltage, the cross-voltage between the drain and the source is not equal to zero. Therefore, big substrate current is occurred. In the present embodiment of the invention, the manufacturing technology of the operational amplifier 10 corresponds to a specific voltage of 3V. Next, the method proceeds to step 304, the transistors MP1, MN1, MP2 and MN2 are disposed in the operational amplifier 10, wherein the sources of the transistors are respectively coupled to the drains of the transistors M22, M24, M31 and M32.

After that, the method proceeds to step 306, the bias signals Vb1~Vb4 are respectively provided to the gates of the transistors MP1, MN1, MP2 and MN2 so that the transistors are biased in saturation region. Thus, the voltages at the sources of the transistors MP1, MN1, MP2 and MN2, that is, the voltages at the drains of the transistors M22, M24, M31 and M32, are respectively equal to the bias signals Vb1-Vth1, Vb2-Vth2, Vb3-Vth3 and Vb4-Vth4, thereby reducing the cross-voltage between the drain and the source of the transistors M22, M24, M31 and M32 so as to reduce the substrate current thereof. The Vth1~Vth4 are respectively the threshold voltages of the transistors MP1, MN1, MP2 and MN2.

The present embodiment of the invention is exemplified by the operational amplifier 10 having four voltage-clamping devices L1~L4. However, the operational amplifier 10 of the present embodiment of the invention can be installed with only a part of the voltage-controlling devices L1~L4 and is still capable of reducing the overall power consumption of the operational amplifier 10.

Figure 4:
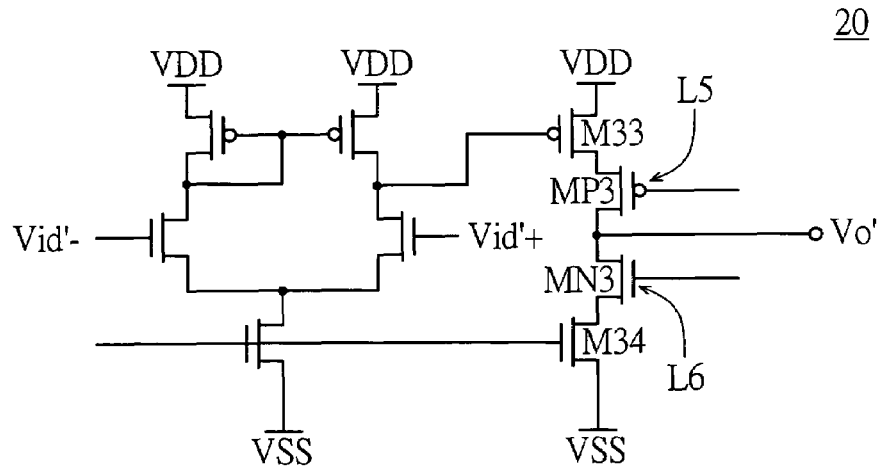
FIG. 4 is another circuit diagram of an operational amplifier according to an embodiment of the invention.

The present embodiment of the invention is exemplified by the situation when the cross-voltage between the gate and the source and the cross-voltage between the drain and the source of the transistors M22, M24, M31 and M32 of the rail-to-rail operational amplifier 10 result in higher substrate current. However, the voltage-clamping device of the present embodiment of the invention is not limited to be used in the rail-to-rail operational amplifier 10. The voltage-clamping device of the present embodiment of the invention can also be used in the operational amplifier of other types or even in an analog circuit for controlling the voltage at the drain of the transistor whose substrate current is too high. For example, as shown in FIG. 4, voltage-controlling devices L5 and L6 whose structure is similar to that of the voltage-controlling devices L3 and L4 of the present embodiment of the invention can be used in another dual-stage operational amplifier 20 for controlling the voltage at the drain of the output transistors M33 and M34.

The present embodiment of the invention is exemplified by the operation of the voltage-controlling devices L1~L6 used in the operational amplifiers 10 and 20. However, the voltage-controlling device of the present embodiment of the invention is not limited to be used in the operational amplifier and can be widely used in the analog circuit of the transistor whose substrate current is too high.

The voltage-clamping device of the present embodiment of the invention is for controlling the voltage at the drain of the transistor(s) whose substrate current is too high due to the biasing condition of the gate, the drain and the source of the operational amplifier or the analog circuit using the voltage-clamping device, so that the voltages at the drain and the source of the transistors are reduced and the corresponding substrate current is reduced accordingly. Thus, the voltage-clamping device of the present embodiment of the invention is capable of effectively resolving the disadvantages of higher substrate current, severer effects of hot electrons, latchup and snapback, shorter lifespan and higher and power consumption encountered in conventional operational amplifier or analog circuit. The invention substantially reduces the negative circuit effects caused due to high substrate current, and enables the operational amplifier and the analog circuit using the same to have the advantages of longer lifespan, lower power consumption and longer endurance.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A voltage-clamping device used in an operational amplifier, wherein the operational amplifier comprises a first transistor, a cross-voltage between a gate and a source of the first transistor is near to a specific voltage and a cross-voltage between a drain and the source of the first transistor is not equal to zero so as to generate a substrate current, the voltage-clamping device comprises:
a second transistor, wherein a source of the second transistor is coupled to the drain of the first transistor, a gate of the second transistor receives a bias signal so that the second transistor is biased in saturation region, and the voltage at the source of the second transistor is made equal to the difference between the bias signal and the threshold voltage of the second transistor, thereby reducing the cross-voltage between the drain and the source of the first transistor, so as to reduce the substrate current accordingly.

2. The voltage-clamping device according to claim 1, wherein the first transistor and the second transistor are both N-type metal oxide semiconductor (MOS) transistors.

3. The voltage-clamping device according to claim 1, wherein the first transistor and the second transistor are both P-type MOS transistors.

4. An operational amplifier, comprising:
an input stage circuit for receiving a differential signal, and accordingly generating an intermediate signal; and
an output stage circuit for generating an output signal in response to the intermediate signal, wherein the output stage circuit comprises:
a first transistor, wherein when the operational amplifier functions, a cross-voltage between a gate and a source of the first transistor is near to a specific voltage and a cross-voltage between a drain and the source of the first transistor is not equal to zero, so as to generate a big substrate current; and
a second transistor, wherein a source of the second transistor is coupled to the drain of the first transistor, a gate of the second transistor receives a bias signal so that the second transistor is biased in saturation region, and the voltage at the source of the second transistor is made equal to the difference between the bias signal and the threshold voltage of the second transistor, thereby reducing the cross-voltage between the drain and the source of the first transistor, so as to reduce the substrate current of the first transistor.

5. The operational amplifier according to claim 4, wherein the output stage circuit is a class AB output circuit.

6. A design method of an operational amplifier, the method comprising:
providing an operational amplifier comprising an output circuit, wherein the operational amplifier has a first transistor, a cross-voltage between a gate and a source of the first transistor is near to a specific voltage, a cross-voltage between a drain and the source of the first transistor is not equal to zero so as to generate a substrate current;
disposing a second transistor in the operational amplifier, wherein a source of the second transistor is coupled to the drain of the first transistor; and
providing a bias signal to a gate of the second transistor so that the second transistor is biased in the saturation region, and a voltage at the source of the second transistor is made equal to a difference between the bias signal and a threshold voltage of the second transistor, thereby a cross-voltage between the drain and the source of the first transistor is clamped, so as to clamp the substrate current of the first transistor.

* * * * *